(12) United States Patent
Wang

(10) Patent No.: US 7,365,396 B2
(45) Date of Patent: Apr. 29, 2008

(54) SOI SRAM PRODUCTS WITH REDUCED FLOATING BODY EFFECT

(75) Inventor: Ping-Wei Wang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 456 days.

(21) Appl. No.: 11/105,452

(22) Filed: Apr. 14, 2005

(65) Prior Publication Data

US 2006/0231891 A1    Oct. 19, 2006

(51) Int. Cl.
*H01L 27/12* (2006.01)
(52) U.S. Cl. .............. 257/350; 257/347; 257/E27.112; 438/149; 365/176
(58) Field of Classification Search ............... 257/347, 257/350
See application file for complete search history.

(56) References Cited

U.S. PATENT DOCUMENTS 5,055,898 A * 10/1991 Beilstein et al. ............ 257/301
5,825,696 A * 10/1998 Hidaka et al. ......... 365/189.09

* cited by examiner

*Primary Examiner*—Jerome Jackson
*Assistant Examiner*—Paul Budd
(74) *Attorney, Agent, or Firm*—Finnegan, Henderson, Farabow, Garrett & Dunner LLP

(57) ABSTRACT

A memory device is formed on a semiconductor-on-insulator (SOI) structure, the SOI structure including a substrate, an insulating layer on the substrate, and a semiconductor film on the insulating layer. The memory device includes a memory array in a memory region of the SOI structure, a plurality of first substrate contacts in the peripheral region of the memory device, and a plurality of second substrate contacts in the memory region of the SOI structure, wherein the first substrate contacts and the second substrate contacts are formed in and over the semiconductor film and in the insulating layer and are electrically connected to the substrate of the SOI structure.

15 Claims, 18 Drawing Sheets

SOI SRAM PRODUCTS WITH REDUCED FLOATING BODY EFFECT

TECHNICAL FIELD

This invention relates generally to a silicon-on-insulator (SOI) static random access memory (SRAM) device having a reduced floating body effect.

BACKGROUND

Semiconductor devices can be formed on bulk semiconductor substrates or semiconductor-on-insulator (SOI) structures. Compared to devices formed on bulk semiconductor substrates (bulk devices), devices formed on SOI structures (SOI devices) generally have lower parasitic capacitances, higher switching speeds, lower power consumption, a higher circuit packing density, and a higher yield.

A conventional SOI device, such as a transistor 100 formed on an SOI structure 102, is shown in FIG. 1. SOI structure 102 includes a semiconductor substrate 104, an insulating layer 106 on semiconductor substrate 104, and a semiconductor film 108 on insulating layer 106. Semiconductor substrate 104 may comprise silicon. Insulating layer 106 may comprise buried silicon oxide. Semiconductor film 108 may comprise a silicon film, a silicon germanium (SiGe) film, or any other semiconductor filme, and may be doped with n-type or p-type impurities. Transistor 100 includes a source 110 and a drain 112 formed as diffusion regions in semiconductor film 108. A channel 114 is defined as a portion of semiconductor film 108 between source 110 and drain 112. Transistor 100 further includes a layer of gate insulator 116 formed over channel 114 and a gate electrode 118 formed on gate insulator 116.

Memory devices such as static random access memory (SRAM) devices have been formed on SOI structures to achieve better performance than SRAM devices formed on bulk semiconductor substrates. Conventional SOI SRAM devices may include transistors similar to transistor 100 and other devices such as capacitors and/or resistors.

FIGS. 2A-2E show an example of a conventional SOI SRAM device 200. FIG. 2A is a plan view of SOI SRAM device 200. As shown in FIG. 2A, SOI SRAM device 200 includes a memory array 202. Memory array 202 is divided into four memory blocks 204. An address decoder 206 decodes address inputs (not shown) to SRAM device 200, provides word line address information to a global word line 208, and provides bit line address information to memory blocks 204.

FIG. 2B shows the structure of each memory block 204. As shown in FIG. 2B, each memory block 204 includes a plurality of smaller memory arrays, or memory banks, 210. Each memory bank 210 corresponds to a local word line decoder 212, a bit line decoder 214, and one or more bit line sense amplifier (BL-SA) circuits 216 (only one of which is shown for each memory bank 210). Local word line decoders 212 are coupled to global word line 208, which is parallel to word lines (not shown) of memory banks 210, to receive the word line address information. Bit line decoders 214 are coupled to address decoder 206 to receive the bit line address information through a local bit line address line 215. BL-SA circuits 216 provide data paths between memory banks 210 and external circuits (not shown).

FIG. 2C shows the structure of each memory bank 210. As shown in FIG. 2C, each memory bank 210 includes an array of memory cells 218 arranged in a plurality of rows each corresponding to a pair of bit lines 220 ($220_1$, $220_2$, $220_3$, . . .) and 222 ($222_1$, $222_2$, $222_3$, . . .) and a plurality of columns each corresponding to a word line 224 ($224_1$, $224_2$, $224_3$, . . .). Bit lines 220 and 222 are connected to a corresponding bit line decoder 214 and at least one corresponding BL-SA circuit 216. Word lines 224 are connected to a corresponding local word line decoder 212. Each memory cell 218 may comprise one or more transistors similar to transistor 100 of FIG. 1. The structure of memory cells 218 is well-known to one skilled in the art and is not illustrated in detail in FIG. 2C.

The performance of conventional SOI SRAM devices is limited by so-called floating-body effects. For example, in an SOI SRAM device including transistor 100, semiconductor film 108, which constitutes a body region of transistor 100, is electrically isolated. Accordingly, the potential of semiconductor film 108 is floating and may be modulated through charging or discharging of the charges in semiconductor film 108. For example, semiconductor film 108 may be charged or discharged through impact ionization currents, junction leakage currents, and/or gate-induced drain leakage current. The charge distribution in semiconductor film 108 is also substantially influenced by a charge distribution in semiconductor substrate 104. Due to such floating-body effects, a conventional SOI SRAM device requires a higher minimum operating voltage $V_{min}$.

According to conventional technologies, to reduce the floating-body effects and to decrease the minimum required operating voltage $V_{min}$, there are generally provided substrate contacts in the peripheral regions of an SOI SRAM device. For example, as shown in FIG. 2A, SOI SRAM device 200 includes a plurality of substrate contacts 230 provided in the peripheral regions thereof. FIG. 2D illustrates a cross-sectional view of one substrate contact 230 along line A-A' of FIG. 2A. As shown in FIG. 2D, SOI SRAM device 200 is formed on an SOI structure 232 including a semiconductor substrate 234, an insulating layer 236 on semiconductor substrate 234, and a semiconductor film 238 on insulating layer 236. A plurality of device isolation regions 240 (only one of which is shown in FIG. 2D) are formed in semiconductor film 238 for providing electrical isolation between different portions of SOI SRAM device 200. Substrate contact 230 may comprise a metal plug provided in a substrate contact hole (not numbered) through both device isolation region 240 and insulating layer 236 and is connected to a heavily doped diffusion region 242 formed in semiconductor substrate 234. Diffusion region 242 has the same conductivity type as semiconductor substrate 234. For example, if semiconductor substrate 234 is p-type, then diffusion region 242 is $p^+$-type. Thus, semiconductor substrate 234 may be properly biased by providing a bias to substrate contact 230, such as by connection to a ground potential, to reduce the floating-body effect of SOI SRAM device 200. As a result, memory device 200 as shown in FIGS. 2A-2D has a reduced minimum operating voltage $V_{min}$ as compared to a device without substrate contacts. For example, the minimum operating voltage $V_{min}$ of memory device 200 may be lower than that of a device without substrate contacts by 0.1V.

FIG. 2A shows substrate contacts 230 to be in a square shape. The substrate contacts may also comprise rectangular contact bars, such as substrate contacts 230' shown in FIG. 2E.

SUMMARY OF THE INVENTION

Consistent with embodiments of the present invention, there is provided a memory device is formed on a semiconductor-on-insulator (SOI) structure, the SOI structure including a substrate, an insulating layer on the substrate, and a semiconductor film on the insulating layer. The memory device includes a memory array in a memory region of the SOI structure, a plurality of first substrate contacts in a peripheral region of the memory device, and a plurality of second substrate contacts in the memory region of the SOI structure, wherein the first substrate contacts and the second substrate contacts are formed in the semiconductor film and in the insulating layer and are electrically connected to the substrate of the SOI structure.

Consistent with embodiments of the present invention, there is also provided a memory device including a memory array formed on a semiconductor-on-insulator (SOI) structure, the SOI structure including a semiconductor substrate, an insulating layer on the semiconductor substrate, and a semiconductor film on the insulating layer. The memory array includes a global word line, a plurality of memory blocks, and a plurality of first substrate contacts. Each memory block includes a plurality of memory banks each including a smaller memory array, a plurality of local word line decoders connected to the global word line, and a plurality of bit line sense amplifier (BL-SA) circuits, wherein each memory bank corresponds to one of the local word line decoders and at least one of the BL-SA circuits. The memory device further includes a plurality of second substrate contacts in the peripheral regions of the memory device. The first substrate contacts and the second substrate contacts are formed in the semiconductor film and in the insulating layer and are electrically connected to the semiconductor substrate of the SOI structure.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts.

Consistent with embodiments of the present invention, there are provided SOI memory devices with reduced body effects.

Figure 3A:
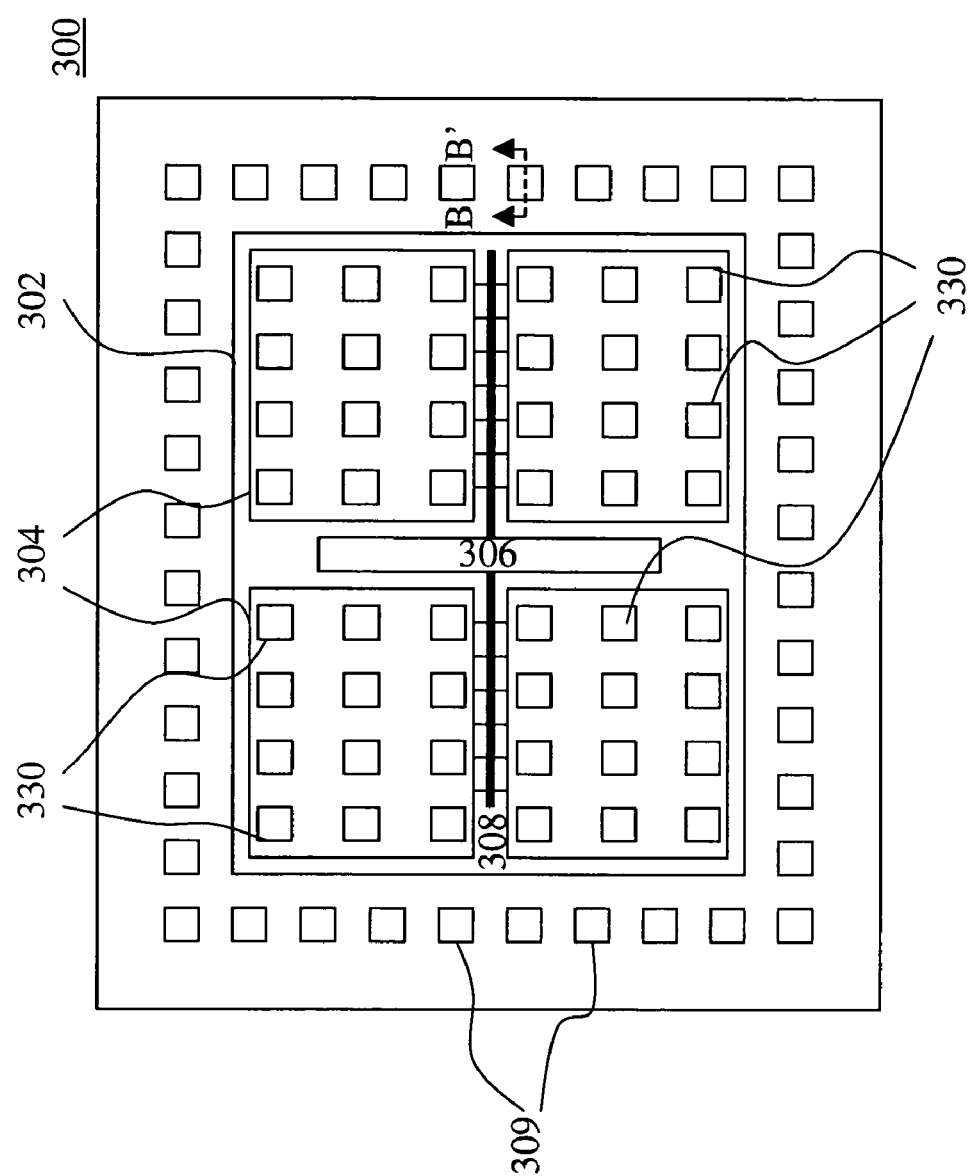
FIGS. 3A-3E show an SOI SRAM device consistent with an embodiment of the present invention.

FIGS. 3A-3E show an SOI SRAM device 300 consistent with an embodiment of the present invention. FIG. 3A is a plan view of SOI SRAM device 300. As shown in FIG. 3A, SOI SRAM device 300 includes a memory region where a memory array 302 is formed. Memory array 302 is divided into several memory blocks 304. An address decoder 306 decodes address inputs (not shown) to SRAM device 300, provides word line address information to a global word line 308, and provides bit line address information to memory blocks 304. SOI SRAM device 300 also includes a plurality of substrate contacts 309 provided in the peripheral regions thereof, i.e., regions outside the memory region where memory array 302 is formed, as shown in FIG. 3A.

Figure 3B:
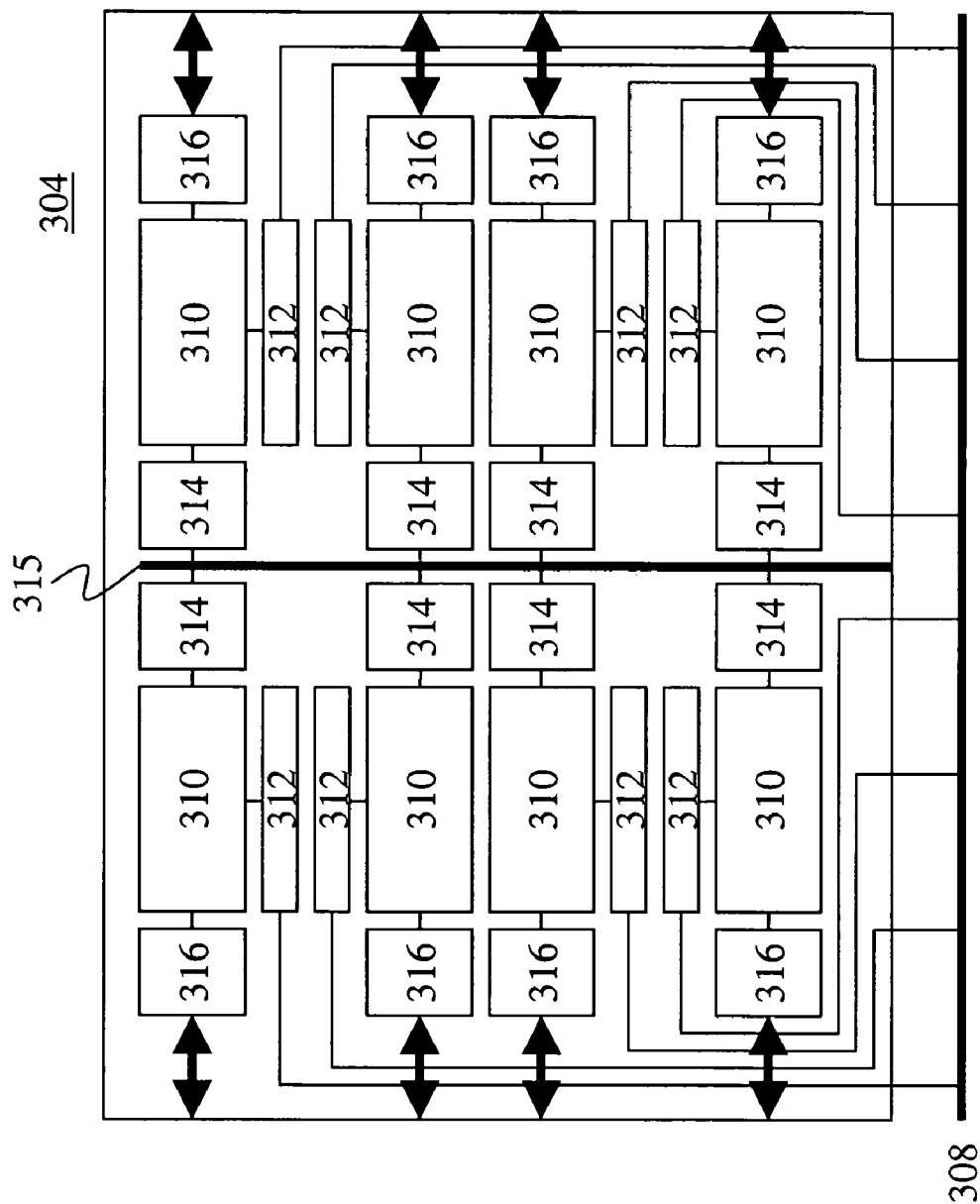

FIG. 3B shows the structure of each memory block 304. As shown in FIG. 3B, each memory block 304 includes a plurality of smaller memory arrays, or memory banks, 310. Each memory bank 310 corresponds to a local word line decoder 312, a bit line decoder 314, and at least one bit line sense amplifier (BL-SA) circuit 316 (only one of which is shown for each memory bank 310). Local word line decoders 312 are coupled to global word line 308 to receive the word line address information and bit line decoders 314 are coupled to address decoder 306 to receive the bit line address information through a local bit line address line 315. BL-SA circuits 316 provide data paths between memory banks 310 and external circuits (not shown).

Figure 1:
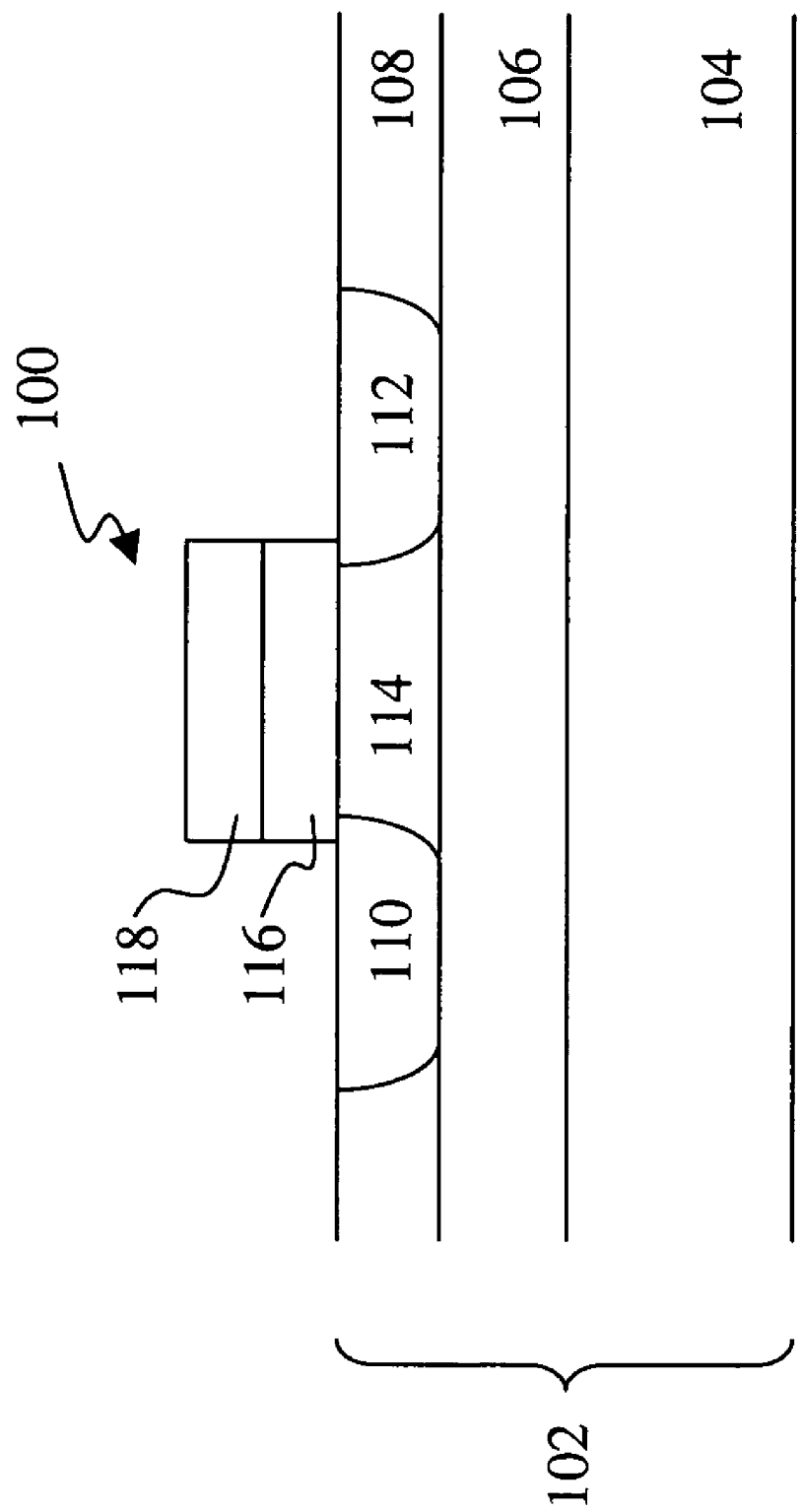
FIG. 1 illustrates a conventional transistor formed on a silicon-on-insulator (SOI) structure.
Figure 2A:
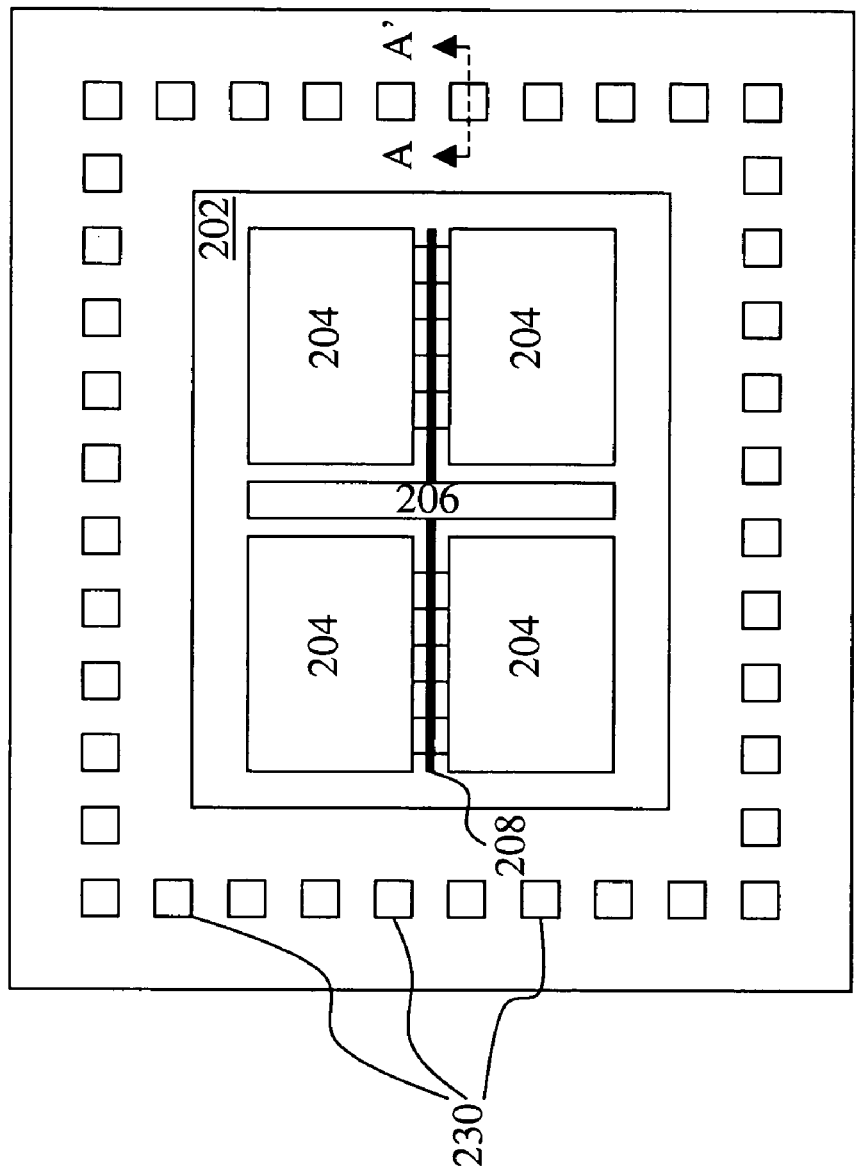
FIGS. 2A-2E show a conventional SOI static random access memory (SRAM) device.
Figure 2B:
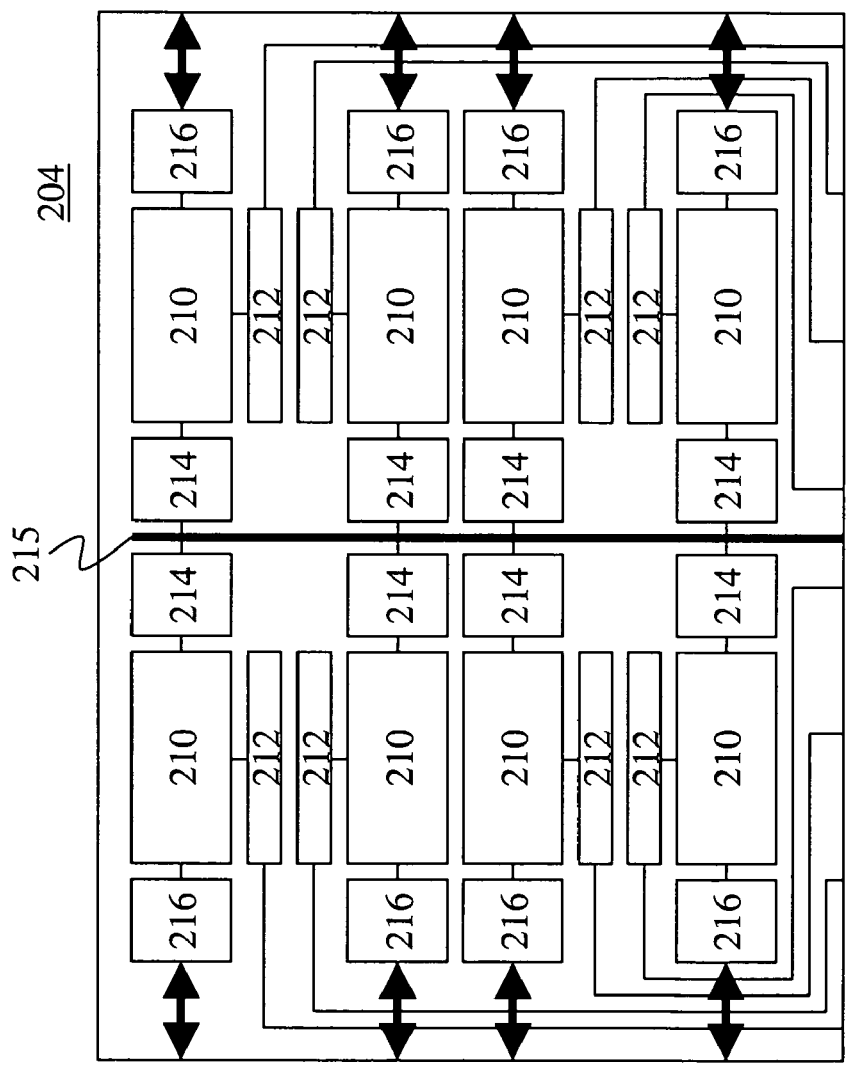
Figure 2C:
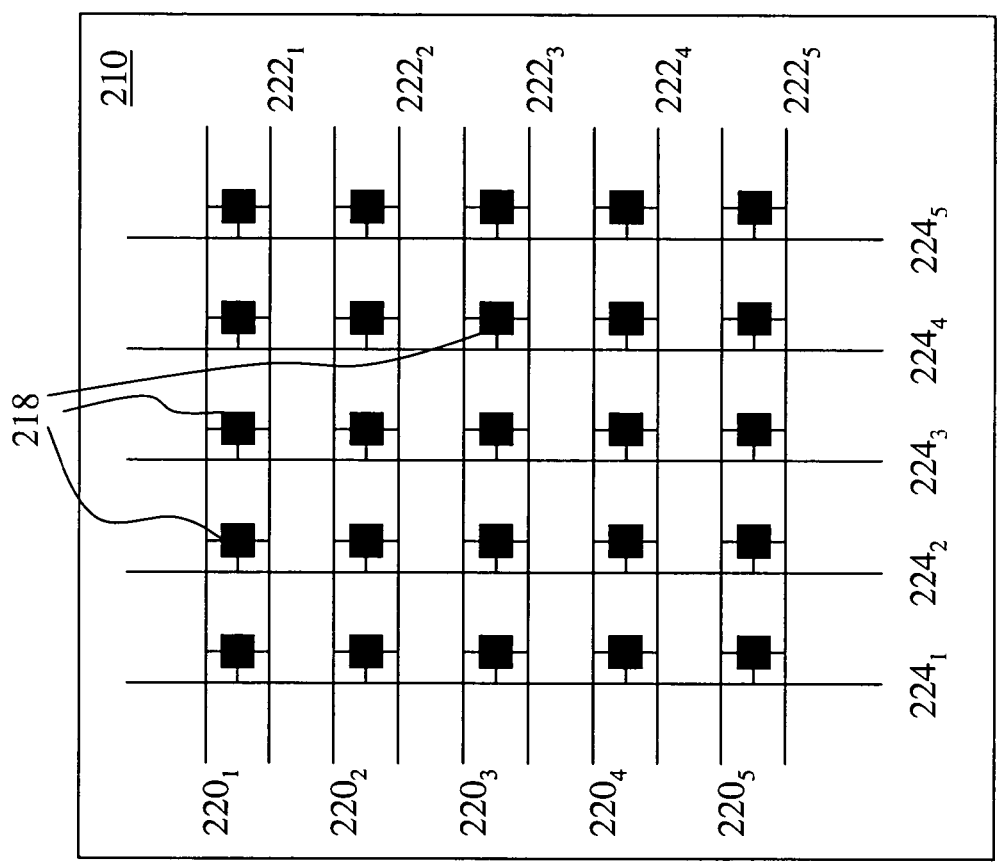
Figure 2D:
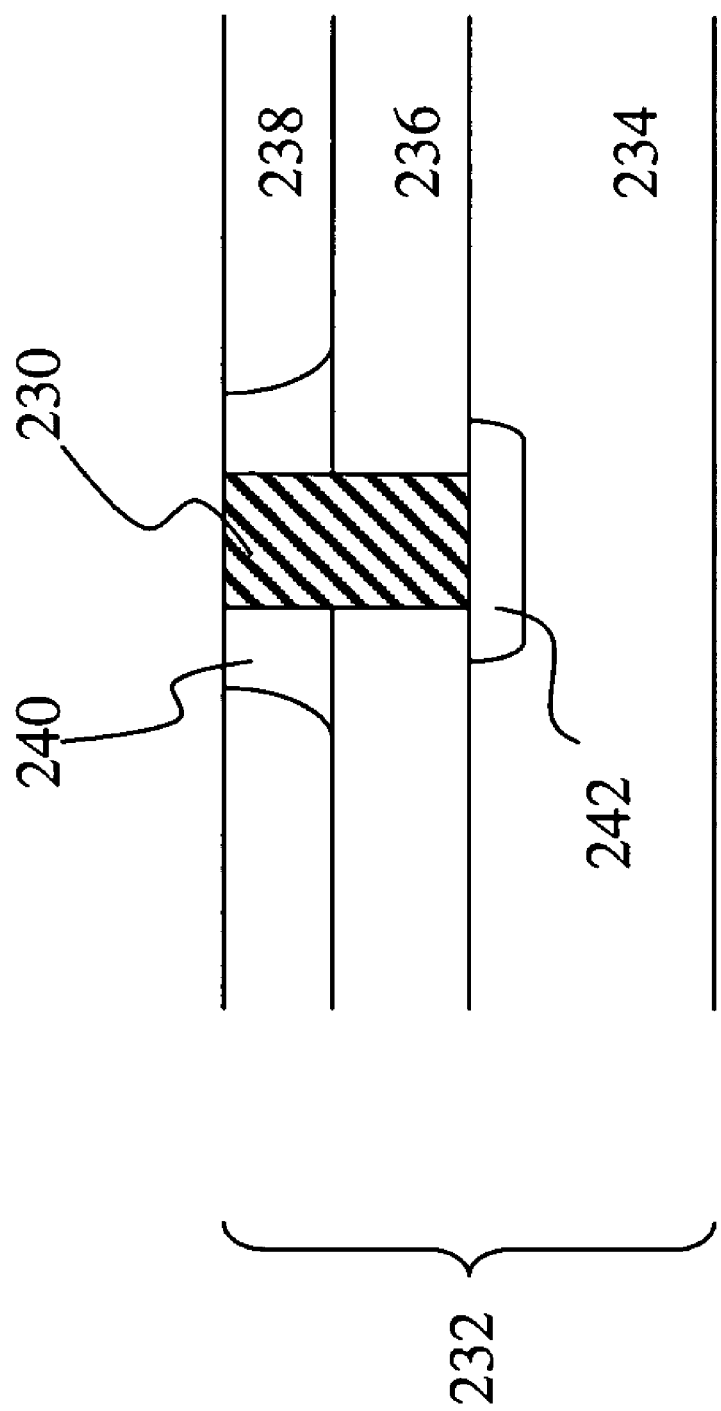
Figure 2E:
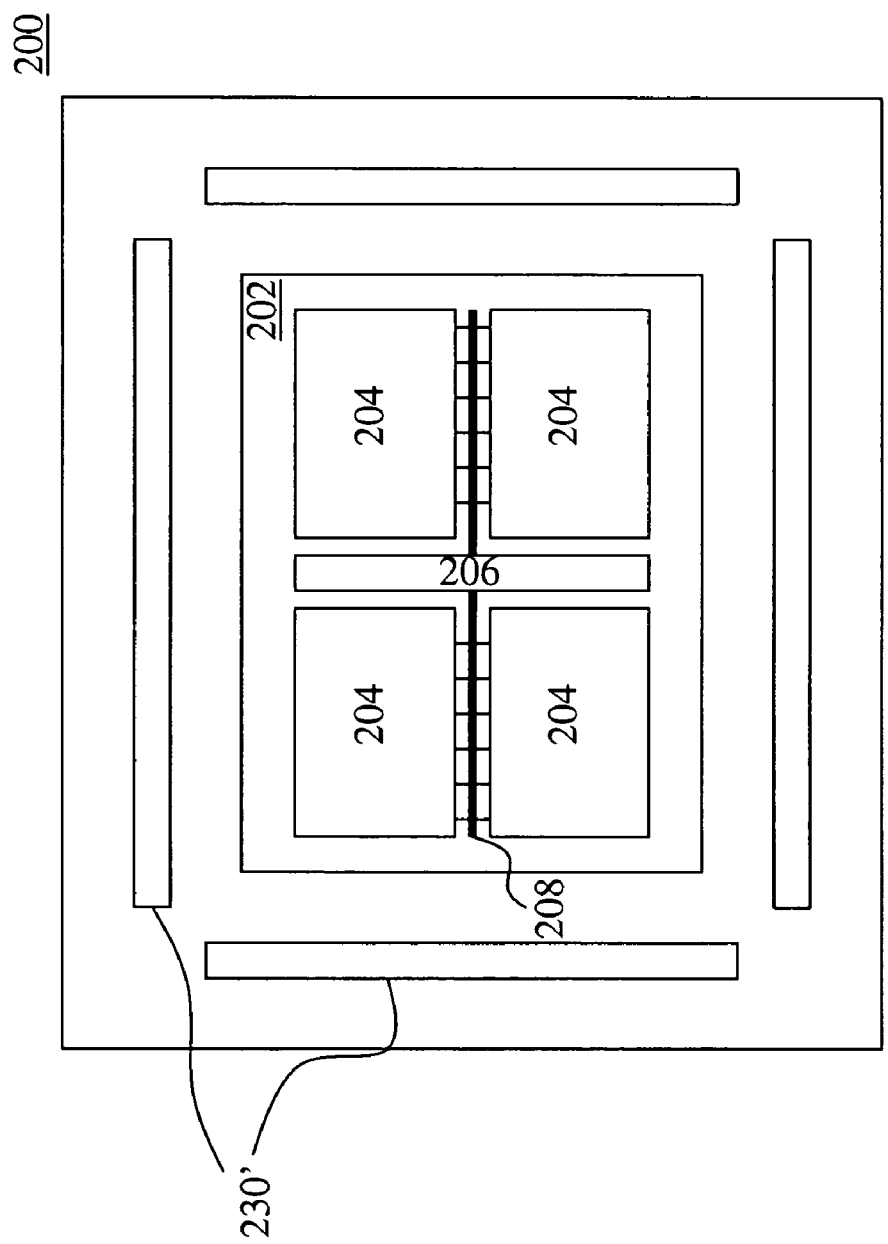
Figure 3C:
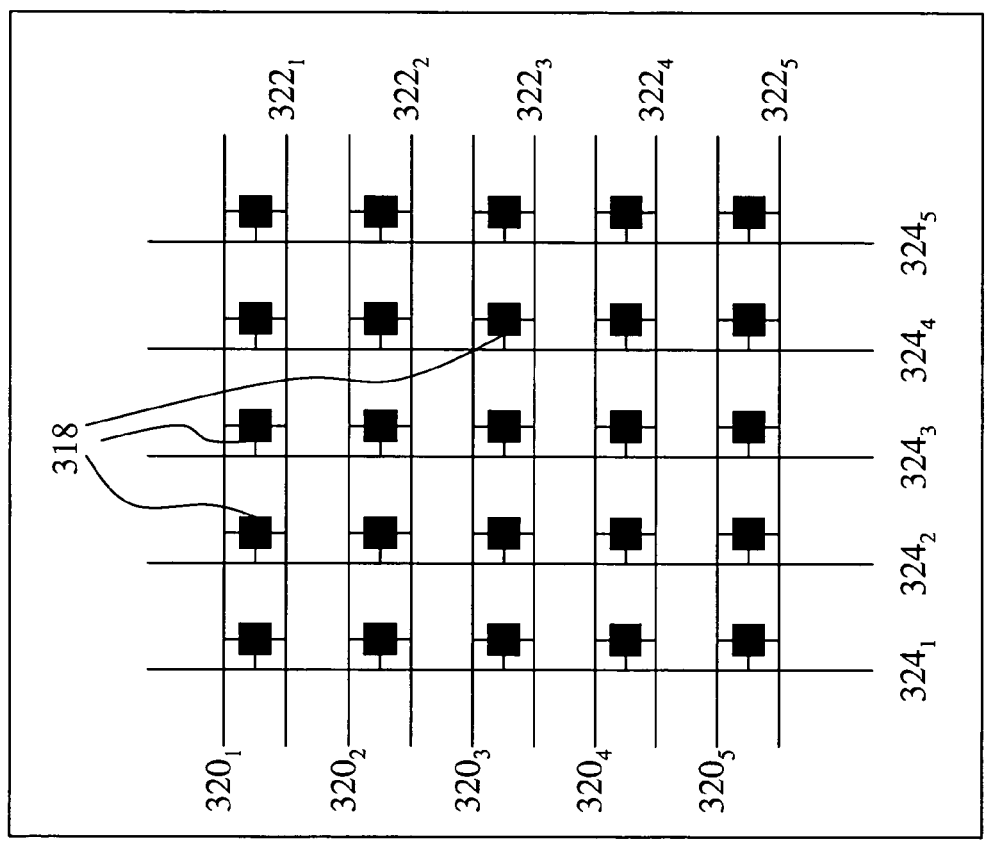

FIG. 3C shows the structure of each memory bank 310. As shown in FIG. 3C, each memory bank 310 includes an array of memory cells 318 arranged in a plurality of rows each corresponding to a pair of bit lines 320 ($320_1$, $320_2$, $320_3$, . . . ) and 322 ($322_1$, $322_2$, $322_3$, . . . ) and a plurality of columns each corresponding to a word line 324 ($324_1$, $324_2$, $324_3$, . . . ). Bit lines 320 and 322 are connected to corresponding bit line decoders 314 and BL-SA circuits 316. Word lines 324 are connected to corresponding local word line decoders 312. Each memory cell 318 may comprise one or more transistors similar to transistor 100 of FIG. 1. The structure of memory cells 318 is well-known to one skilled in the art and is not illustrated in detail in FIG. 3C.

Consistent with the present invention, there are also provided substrate contacts in the memory region. For example, as shown in FIG. 3A, SOI SRAM device 300 further includes a plurality of substrate contacts 330 provided in the memory region where memory array 302 is formed.

By providing a fixed voltage bias, such as a ground potential, to substrate contacts 309 and 330, the floating-body effects may be substantially suppressed in SOI SRAM device 300.

Figure 3D:
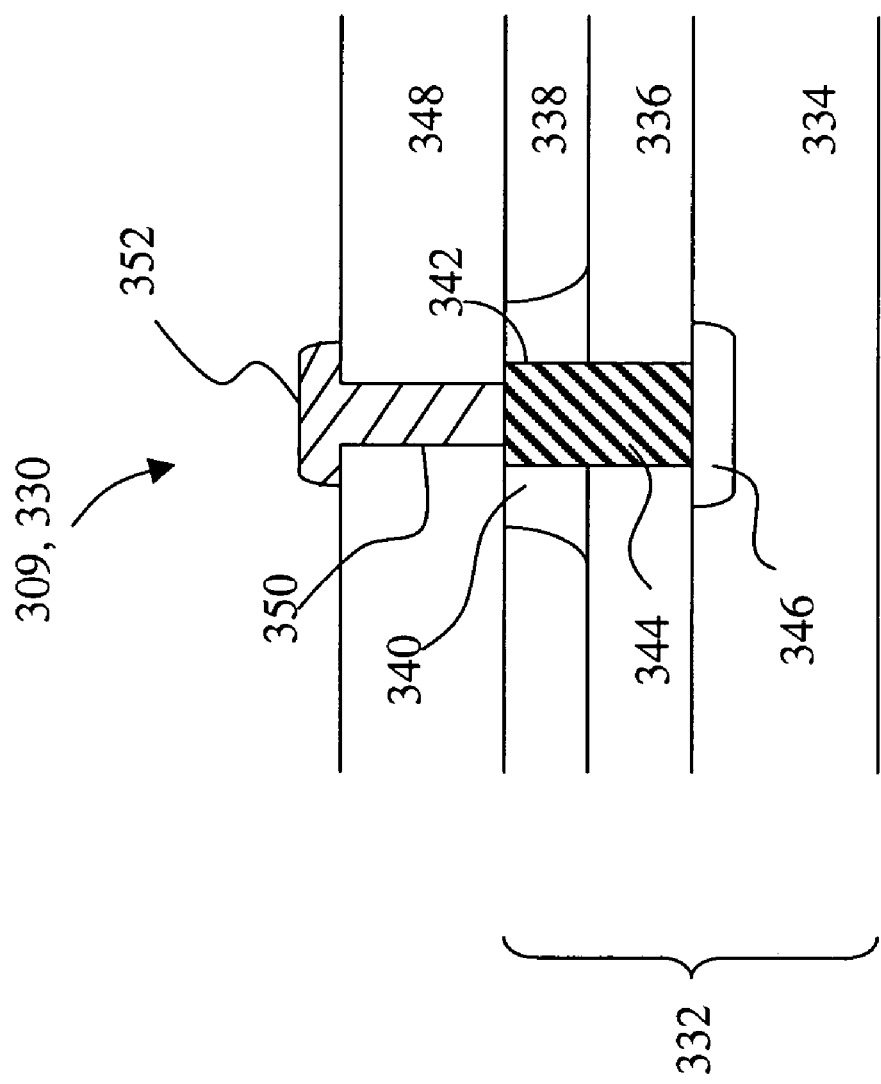

Substrate contacts 309 and 330 may be formed to have the same structure. FIG. 3D illustrates a cross-sectional view of one substrate contact 309 or 330 consistent with an embodiment of the present invention. As shown in FIG. 3D, SOI SRAM device 300 is formed on an SOI structure 332 including a semiconductor substrate 334, an insulating layer 336 on semiconductor substrate 334, and a semiconductor film 338 on insulating layer 336. Semiconductor substrate 334 may comprise silicon. Insulating layer 336 may comprise an oxide such as buried silicon oxide. Semiconductor film 338 may comprise silicon. A plurality of device isolation regions 340 (only one of which is shown in FIG. 3D) are formed in semiconductor film 338 for providing electrical isolation between different portions of SOI SRAM device 300. A substrate contact hole 342 is formed through both device isolation region 340 and insulating layer 336. A conductive plug 344 is formed in substrate contact hole 342 and is in contact with a heavily doped diffusion region 346 formed in semiconductor substrate 334. Conductive plug 344 may comprise a conductive material such as doped polysilicon or a metal. Diffusion region 346 has the same conductivity type as semiconductor substrate 334. For example, if semiconductor substrate 334 is p-type, then diffusion region 346 is p+-type. A layer of inter-layer dielectric (ILD) 348 is provided on semiconductor film 338. A contact through hole 350 is formed in ILD 348 and a metal plug 352 is formed in contact through hole 350 and is in contact with conductive plug 344. Thus, as shown in FIG. 3D, substrate contact 309 or 330 comprises a stacked structure including metal plug 352 and conductive plug 344.

The manufacturing process of stacked substrate contacts 309 and 330 should now be understood by one skilled in the art. For example, substrate contacts 309 or 330 shown in FIG. 3D may be formed as follows. First, substrate contact hole 342 in device isolation region 340 and insulating layer 336 is formed by etching. Then, diffusion region 346 is formed by ion implantation and diffusion. Conductive plug 344 is formed by depositing doped polysilicon in substrate contact hole 342 and on semiconductor film 338 and then planarizing the doped polysilicon using chemical mechanical planarization or etching. ILD 348 is then deposited on semiconductor film 338. Contact through hole 350 is formed by etching ILD 348. A layer of metal is deposited on ILD 348 and in contact through hole 350 and then etched to form metal plug 352.

Figure 3E:
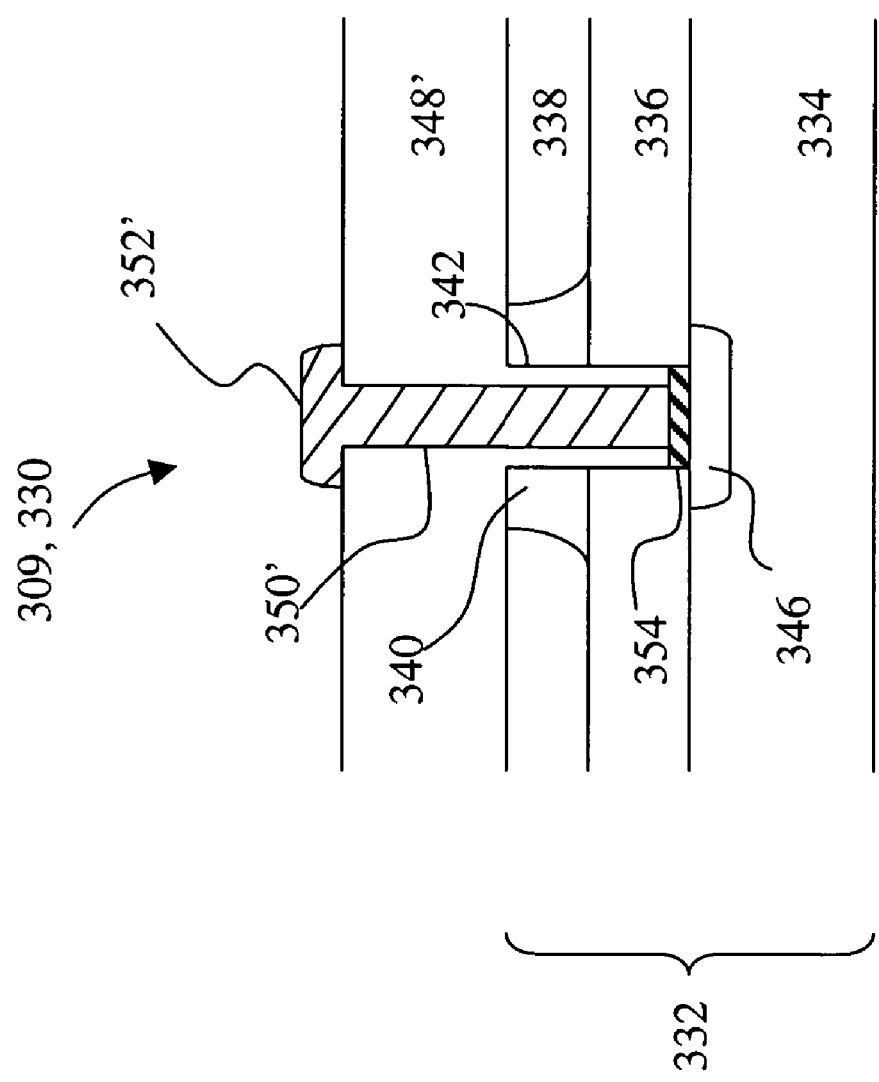

Consistent with another embodiment of the present invention, a salicide process may be used to form substrate contacts 309 and 330 to each comprise a salicide layer, as shown in FIG. 3E. In FIGS. 3D and 3E, the same reference numerals refer to the same parts. In FIG. 3E, a salicide layer 354 is formed in the bottom of substrate contact hole 342. An ILD 348' is deposited both on semiconductor film 338 and in substrate contact hole 342. A contact through hole 350' is formed in ILD 348', and a metal plug 352' is formed in contact through hole 350'. Thus, as shown in FIG. 3E, metal plug 352' and salicide layer 354 constitute substrate contact 309 or 330. The salicide process is well-known to one skilled in the art and is not discussed in detail herein.

Figure 4A:
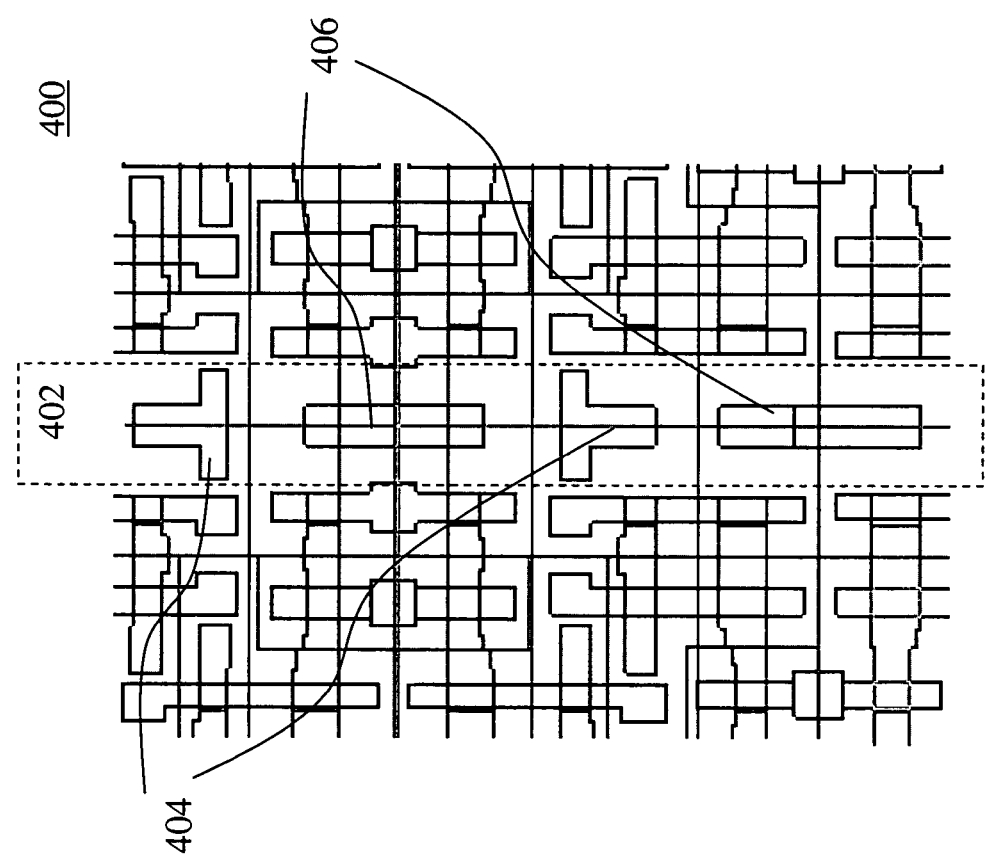
FIGS. 4A-4B illustrate a disposition of substrate contacts consistent with an embodiment of the present invention.
Figure 4B:
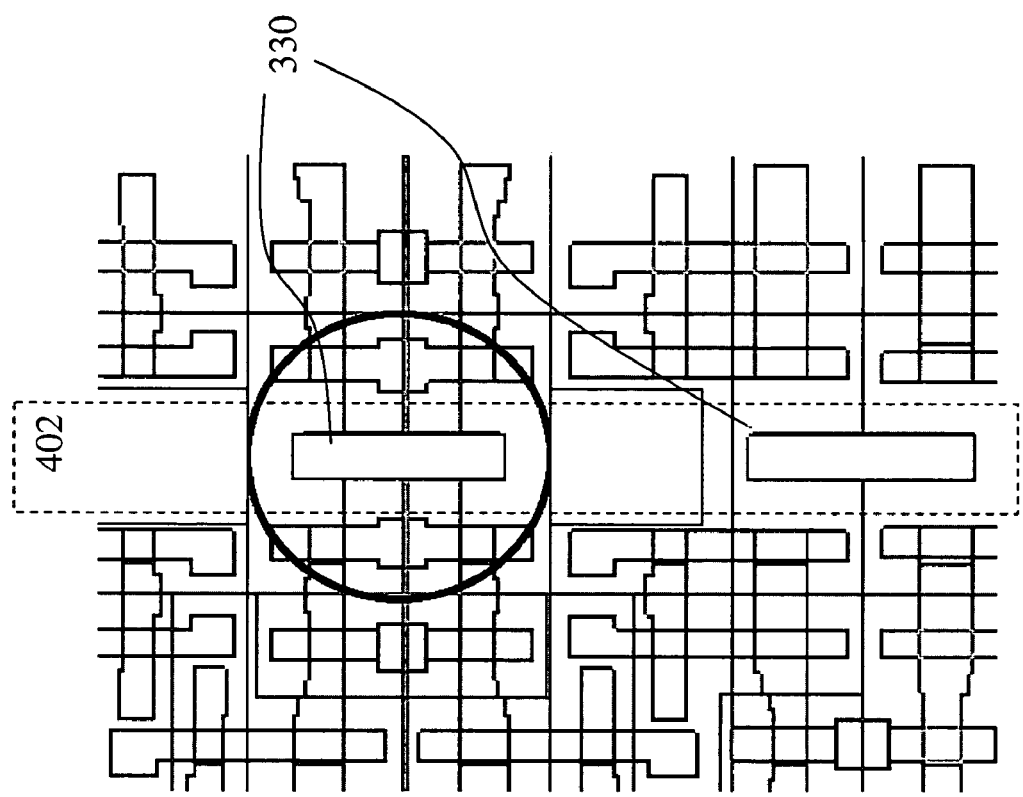

Consistent with an embodiment of the present invention, conductive plugs 344 of substrate contacts 330 may be formed in regions where no other features of SOI SRAM device 300 are formed. Conventionally, to avoid the efforts of redesigning layouts for SOI devices, an SOI SRAM device may be formed to have a layout similar to that of a bulk SRAM device. For example, FIG. 4A shows a portion 400 of a layout of a bulk SRAM device. As shown in FIG. 4A, in a region 402, features such as marks 404 for alignment purposes and well pick-ups 406 for forming contacts to diffusion wells are formed. When an SOI SRAM device is formed to have a layout similar to layout portion 400 of the bulk SRAM device, well pick-ups 406 are not formed. Therefore, substrate contacts 330 may be formed in such regions corresponding to portions of the bulk SRAM device where well pick-ups 406 are formed, or well pick-up regions, as shown in FIG. 4B.

Consistent with another embodiment of the present invention, substrate contacts 330 may be formed in regions where a metal layer for forming metal plug 352 (FIG. 3D) or 352' (FIG. 3E) is not required for forming other portions of memory device 300. A semiconductor device or circuit may include several layers of metal patterns each isolated from the others by inter-metal dielectrics (IMD). The several layers of metal patterns are conventionally referred to as metal-1, metal-2, etc., where metal-1 is at the lowest level. For example, SOI SRAM device 300 may include patterned metal-1, metal-2, metal-3, and metal plug 352 or 352' may be included with patterned metal-1. Thus, substrate contacts 330 may be formed in regions where conventional features of metal-1 are absent.

Figure 5:
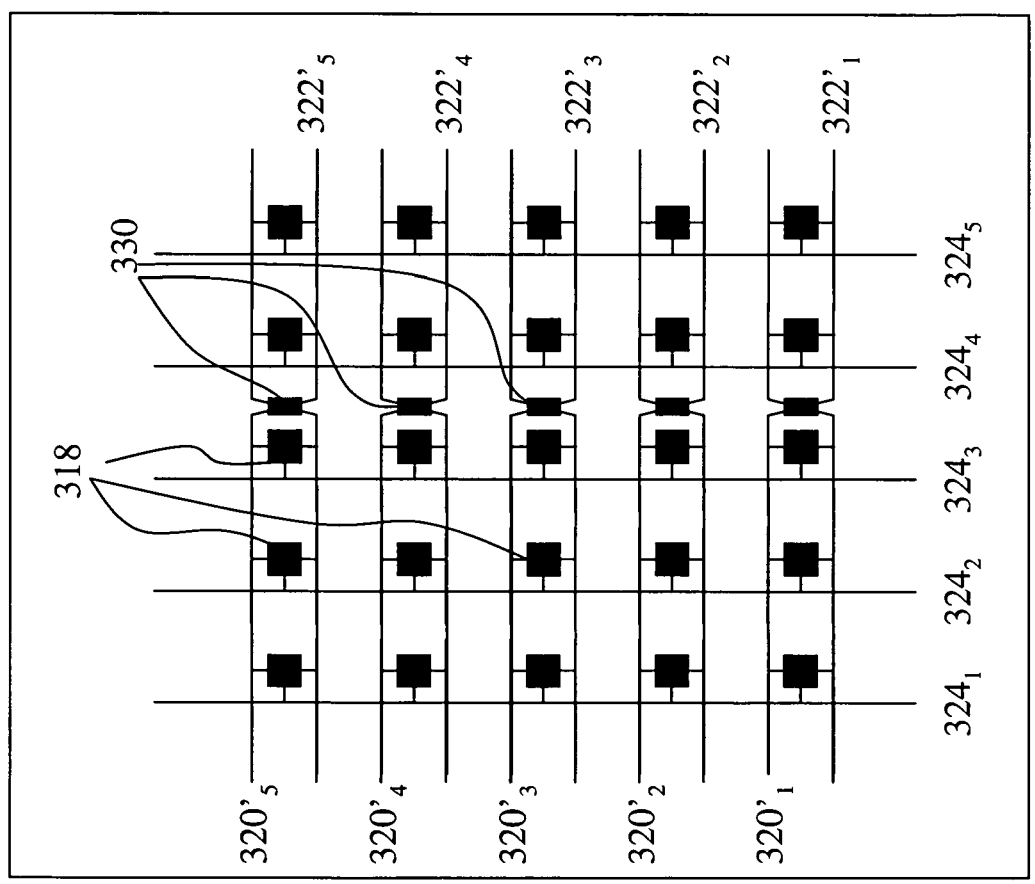
FIGS. 5 and 6 illustrate a disposition of substrate contacts consistent with another embodiment of the present invention.
Figure 6:
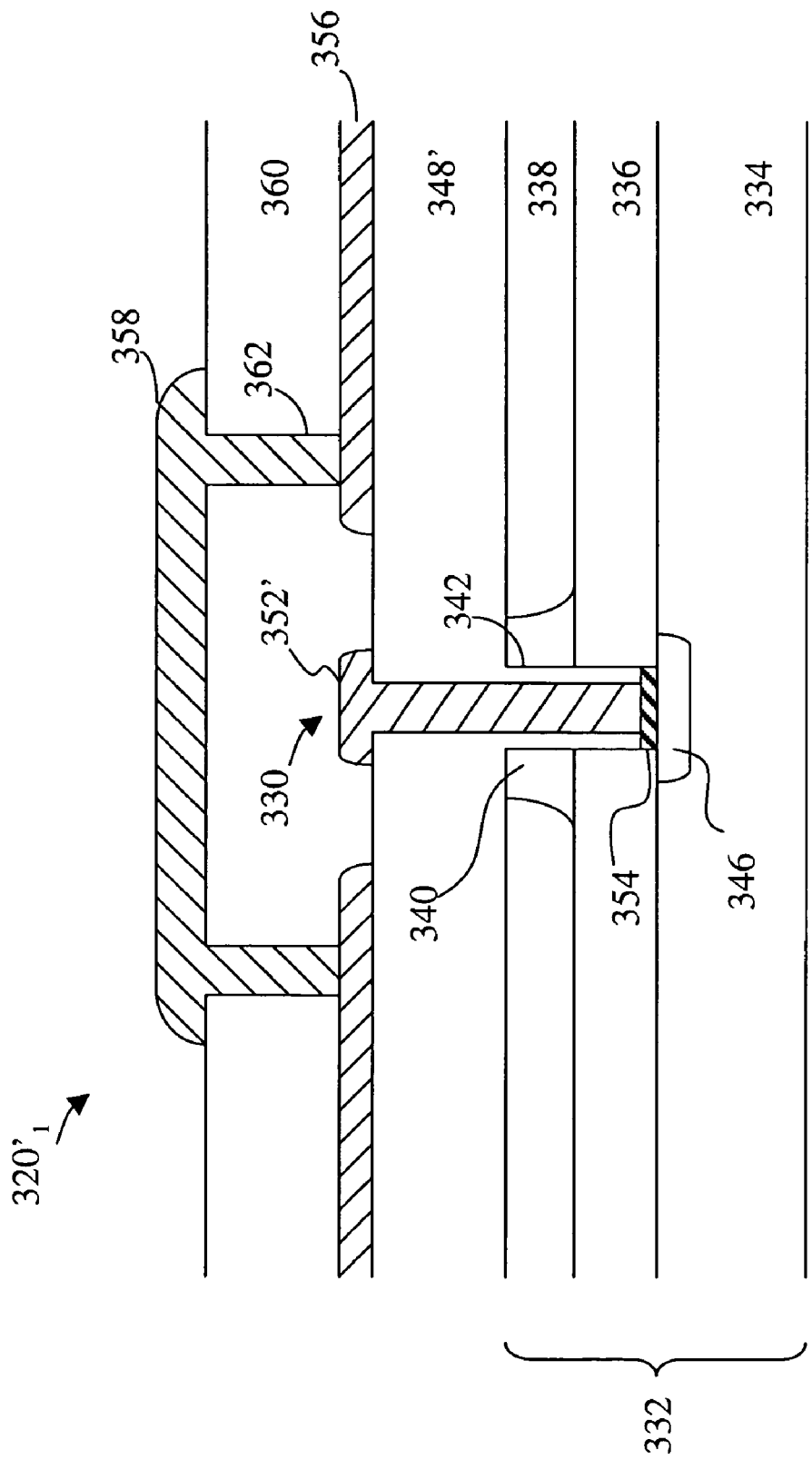

In one aspect, SOI SRAM device 300 may employ a so-called twisted bit line architecture, where bit lines of a bit-line pair cross each other at one or more crossing points. FIG. 5 shows a portion of memory bank 310 with the twisted bit line architecture. As shown in FIG. 5, each pair of bit lines 320' ($320'_1$, $320'_2$, $320'_3$, . . .) and 322' ($322'_1$, $322'_2$, $322'_3$, . . .) cross each other at certain crossing points. Generally each pair of bit lines 320' and 322' cross each other through a higher level of metal such as metal-2, and FIG. 6 shows a cross-sectional view of a crossing point of bit lines 320' and 322', only one bit line 320', being shown. As shown in FIG. 6, bit line $320'_1$ includes discontinuous segments 356 (two of which are shown in FIG. 6) of metal-1 and connectors 358 (only one of which is shown in FIG. 6) formed of metal-2. An IMD 360 is deposited between metal-1 and metal-2, and connectors 358 connect discontinuous segments 356 through vias 362 formed in IMD 360. Because bit lines 320' and 322' cross each other through a higher level of metal such as metal-2, substrate contacts 330 may be formed at the crossing points, e.g., in the gaps between discontinuous segments 356, as shown in FIG. 6.

Figure 7:
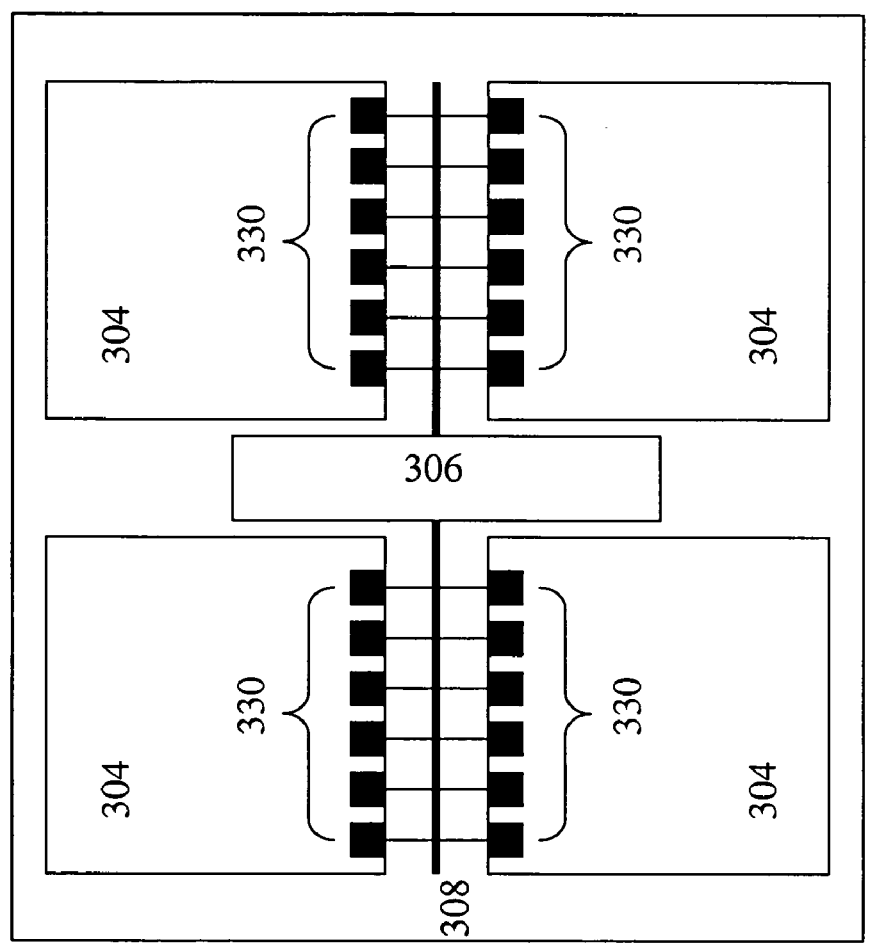
FIG. 7 illustrates a disposition of substrate contacts consistent with another embodiment of the present invention.

Also, local word decoders 312 connect to global word line 308 through a higher level of metal. Consequently, substrate contacts 330 may be formed at points where local word decoders 312 connect to global word line 308, as shown in FIG. 7. FIG. 7 is a simplified plan view of memory array 302 showing only memory blocks 304, global word line 308, and substrate contacts 330 formed in memory blocks 304.

Figure 8:
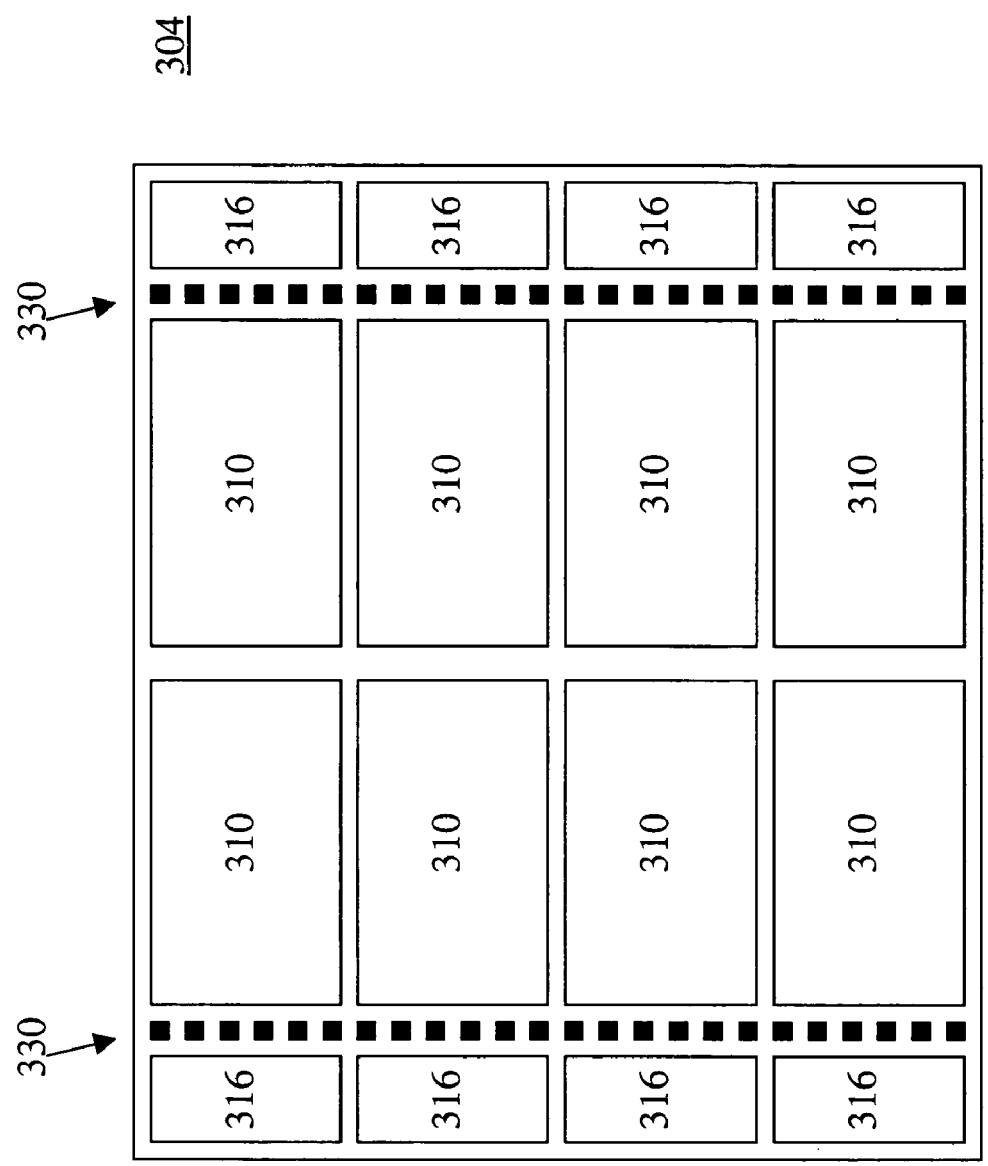
FIG. 8 illustrates a disposition of substrate contacts consistent with another embodiment of the present invention.

Consistent with an embodiment of the present invention, substrate contacts 330 may also be formed between the edges of bit lines 320 and 322 or 320' and 322' and BL-SA circuits 316, as shown in FIG. 8. FIG. 8 is a simplified plan view of one memory block 304 showing only memory banks 310, BL-SA circuits 316, and substrate contacts 330 formed therebetween.

Figure 9:
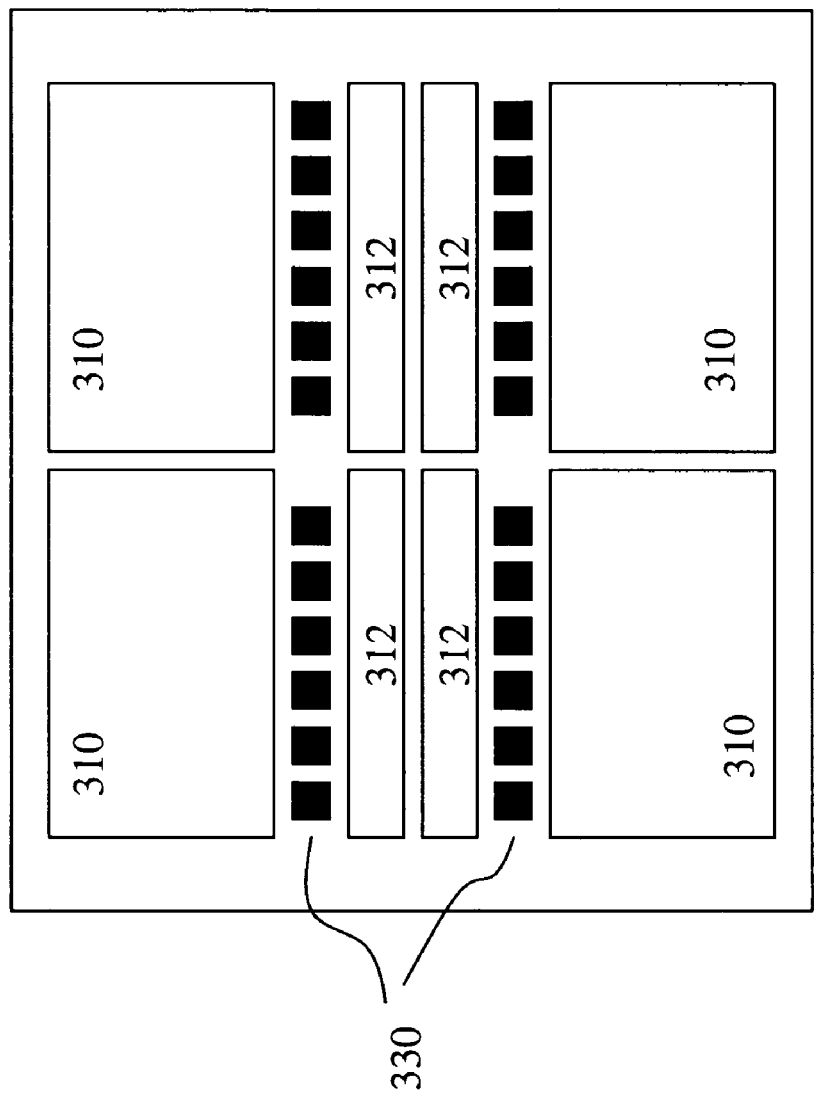
FIG. 9 illustrates a disposition of substrate contacts consistent with another embodiment of the present invention.

Consistent with another embodiment of the present invention, substrate contacts 330 may also be formed between the edges of memory arrays in memory banks 310 and local word line decoders 312, as shown in FIG. 9. FIG. 9 is a simplified plan view of one memory block 304 showing only memory banks 310, local word line decoders 312, and substrate contacts 330 formed therebetween.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory device formed on a semiconductor-on-insulator (SOI) structure, the SOI structure comprising a substrate, an insulating layer on the substrate, and a semiconductor film on the insulating layer, the memory device comprising:
a memory array in a memory region of the SOI structure;
a plurality of first substrate contacts in a peripheral region of the memory device; and
a plurality of second substrate contacts in the memory region of the SOI structure,
wherein the first substrate contacts and the second substrate contacts are formed in the semiconductor film and in the insulating layer and are electrically connected to the substrate of the SOI structure; and
wherein the memory array includes a plurality of pairs of bit lines, the bit lines of at least one pair crossing each other at one or more crossing points, and wherein at least one of the second substrate contacts is formed at the crossing point of the bit lines.

2. A memory device formed on a semiconductor-on-insulator (SOI) structure, the SOI structure comprising a substrate, an insulating layer on the substrate. and a semiconductor film on the insulating layer. the memory device comprising:
a memory array in a memory region of the SOI structure;
a plurality of first substrate contacts in a peripheral region of the memory device; and
a plurality of second substrate contacts in the memory region of the SOI structure,
wherein the first substrate contacts and the second substrate contacts are formed in the semiconductor film and in the insulating layer and are electrically connected to the substrate of the SOI structure; and
wherein the memory array includes a global word line and a plurality of memory banks each including a smaller memory array, the memory banks including a plurality of local word line decoders connected to the global word line, and wherein one of the second substrate contacts is formed at one of the points where the local word lines connect to the global word line.

3. A memory device formed on a semiconductor-on-insulator (SOI) structure, the SOI structure comprising a substrate, an insulating layer on the substrate, and a semiconductor film on the insulating layer, the memory device comprising:
a memory array in a memory region of the SOI structure;
a plurality of first substrate contacts in a peripheral region of the memory device; and
a plurality of second substrate contacts in the memory region of the SOI structure,
wherein the first substrate contacts and the second substrate contacts are formed in the semiconductor film and in the insulating layer and are electrically connected to the substrate of the SOI structure; and
wherein the memory array includes a plurality of memory banks each including a smaller memory array and a plurality of corresponding bit line sense amplifier (BL-SA) circuits, and wherein at least one of the second substrate contacts is formed between an edge of one memory bank and the corresponding BL-SA circuit.

4. A memory device formed on a semiconductor-on-insulator (SOI) structure, the SOI structure comprising a substrate, an insulating layer on the substrate, and a semiconductor film on the insulating layer, the memory device comprising:
a memory array in a memory region of the SOI structure;
a plurality of first substrate contacts in a peripheral region of the memory device; and
a plurality of second substrate contacts in the memory region of the SOI structure,
wherein the first substrate contacts and the second substrate contacts are formed in the semiconductor film and in the insulating layer and are electrically connected to the substrate of the SOI structure; and
wherein the memory array includes a plurality of memory banks each including a smaller memory array and a plurality of corresponding local word line decoders, and wherein at least one of the second substrate contacts is formed between an edge of one memory bank and the corresponding local word line decoder.

5. A memory device formed on a semiconductor-on-insulator (SOI) structure, the SOI structure comprising a substrate, an insulating layer on the substrate, and a semiconductor film on the insulating layer, the memory device comprising:
a memory array in a memory region of the SOI structure;
a plurality of first substrate contacts in a peripheral region of the memory device; and
a plurality of second substrate contacts in the memory region of the SOI structure,
a substrate contact hole formed through the semiconductor film and the insulating layer;
a layer of inter-layer dielectric (ILD) formed over the semiconductor film;
a contact through hole formed in the layer of ILD. wherein one or more of the first substrate contacts and the second substrate contacts include
a conductive plug in the substrate contact hole, and
a metal plug in the contact through hole;
wherein the first substrate contacts and the second substrate contacts are formed in the semiconductor film and in the insulating layer and are electrically connected to the substrate of the SOI structure; and
wherein the substrate of the SOI structure comprises a semiconductor including a heavily doped diffusion region, the heavily doped diffusion region and the substrate being of the same conductivity type, and wherein the conductive plug is in contact with the heavily doped diffusion region.

6. The memory device of claim 5, wherein the semiconductor film includes a plurality of device isolation regions, and the substrate contact hole is formed through one of the device isolation regions.

7. A memory device formed on a semiconductor-on-insulator (SOI) structure, the SOI structure comprising a substrate, an insulating layer on the substrate, and a semiconductor film on the insulating layer, the memory device comprising:
a memory array in a memory region of the SOI structure;
a plurality of first substrate contacts in a peripheral region of the memory device; and
a plurality of second substrate contacts in the memory region of the SOI structure,
a substrate contact hole formed through the semiconductor film and the insulating layer;
a layer of inter-layer dielectric (ILD) formed over the semiconductor film and in the substrate contact hole; and a contact through hole formed in the layer of ILD and in the substrate contact hole,
wherein one or more of the first substrate contacts and the second substrate contacts include
a salicide layer formed in a bottom of the substrate contact hole, and
a metal plug provided in the contact through hole and in the substrate contacts hole; and
wherein the first substrate contacts and the second substrate contacts are formed in the semiconductor film and in the insulating layer and are electrically connected to the substrate of the SOI structure.

8. The memory device of claim 7, wherein the substrate of the SOI structure comprises a semiconductor including a heavily doped diffusion region, the heavily doped diffusion region and the substrate being of the same conductivity type, and wherein the salicide layer is in contact with the heavily doped diffusion region.

9. The memory device of claim 7, wherein the semiconductor film includes a plurality of device isolation regions, and the substrate contact hole is formed through one of the device isolation regions.

10. A memory device formed on a semiconductor-on-insulator (SOI) structure, the SOI structure including a semiconductor substrate, an insulating layer on the semiconductor substrate, and a semiconductor film on the insulating layer, the memory device comprising:
a memory array in a memory region of the SOI structure, including
a global word line,
a plurality of memory blocks, each memory block including
a plurality of memory banks each including a smaller memory array,
a plurality of local word line decoders connected to the global word line, and
a plurality of bit line sense amplifier (BL-SA) circuits,
wherein each memory bank corresponds to one of the local word line decoders and at least one of the BL-SA circuits, and
a plurality of first substrate contacts; and
a plurality of second substrate contacts in the peripheral regions of the memory device,
wherein the first substrate contacts and the second substrate contacts are formed in the semiconductor film and in the insulating layer and are electrically connected to the semiconductor substrate of the SOI structure; and
wherein the memory banks include a plurality of pairs of bit lines, the bit lines of at least one pair crossing each other at one or more crossing points, and wherein at least one of the first substrate contacts is formed at the crossing point of the bit lines.

11. A memory device formed on a semiconductor-on-insulator (SOI) structure, the SOI structure including a semiconductor substrate, an insulating layer on the semiconductor substrate, and a semiconductor film on the insulating layer, the memory device comprising:
a memory array in a memory region of the SOI structure, including
a global word line,
a plurality of memory blocks, each memory block including
a plurality of memory banks each including a smaller memory array,
a plurality of local word line decoders connected to the global word line, and
a plurality of bit line sense amplifier (BL-SA) circuits,
wherein each memory bank corresponds to one of the local word line decoders and at least one of the BL-SA circuits, and
a plurality of first substrate contacts; and
a plurality of second substrate contacts in the peripheral regions of the memory device,
wherein the first substrate contacts and the second substrate contacts are formed in the semiconductor film and in the insulating layer and are electrically connected to the semiconductor substrate of the SOI structure; and
wherein at least one of the first substrate contacts is formed at one of the points where the local word line decoders connect to the global word line.

12. A memory device formed on a semiconductor-on-insulator (SOI) structure, the SOI structure including a semiconductor substrate, an insulating layer on the semiconductor substrate, and a semiconductor film on the insulating layer, the memory device comprising:
a memory array in a memory region of the SOI structure, including
a global word line,
a plurality of memory blocks, each memory block including
a plurality of memory banks each including a smaller memory array,
a plurality of local word line decoders connected to the global word line, and
a plurality of bit line sense amplifier (BL-SA) circuits,
wherein each memory bank corresponds to one of the local word line decoders and at least one of the BL-SA circuits, and
a plurality of first substrate contacts; and
a plurality of second substrate contacts in the peripheral regions of the memory device,
wherein the first substrate contacts and the second substrate contacts are formed in the semiconductor film and in the insulating layer and are electrically connected to the semiconductor substrate of the SOI structure; and
wherein at least one of the first substrate contacts is formed between an edge of one memory bank and the corresponding local word line decoder.

13. A memory device formed on a semiconductor-on-insulator (SOI) structure, the SOI structure including a semiconductor substrate, an insulating layer on the semiconductor substrate, and a semiconductor film on the insulating layer, the memory device comprising:
a memory array in a memory region of the SOI structure, including
a global word line,
a plurality of memory blocks, each memory block including
a plurality of memory banks each including a smaller memory array,
a plurality of local word line decoders connected to the global word line, and
a plurality of bit line sense amplifier (BL-SA) circuits, wherein each memory bank corresponds to one of the local word line decoders and at least one of the BL-SA circuits, and a plurality of first substrate contacts; and a plurality of second substrate contacts in the peripheral regions of the memory device, wherein the first substrate contacts and the second substrate contacts are formed in the semiconductor film and in the insulating layer and are electrically connected to the semiconductor substrate of the SOI structure; and wherein at least one of the first substrate contacts is formed between an edge of one memory bank and the corresponding BL-SA circuit.

14. The memory device of any of claims 10-13, further including a substrate contact hole formed through the semiconductor film and the insulating layer, a layer of inter-layer dielectric (ILD) formed over the semiconductor film, and a contact through hole formed in the layer of ILD, wherein one or more of the first substrate contacts and the second substrate contacts include a conductive plug in the substrate contact hole, the conductive plug comprising doped polysilicon or a metal, and a metal plug in the contact through hole.

15. A memory device formed on a semiconductor-on-insulator (SOI) structure, the SOI structure including a semiconductor substrate, an insulating layer on the semiconductor substrate, and a semiconductor film on the insulating layer, the memory device comprising:

a memory array in a memory region of the SOI structure, including a global word line.

a plurality of memory blocks, each memory block including a plurality of memory banks each including a smaller memory array, a plurality of local word line decoders connected to the global word line, and a plurality of bit line sense amplifier (BL-SA) circuits, wherein each memory bank corresponds to one of the local word line decoders and at least one of the BL-SA circuits, and a plurality of first substrate contacts; and a plurality of second substrate contacts in the peripheral regions of the memory device, wherein the first substrate contacts and the second substrate contacts are formed in the semiconductor film and in the insulating layer and are electrically connected to the semiconductor substrate of the SOI structure; and further including a substrate contact hole formed through the semiconductor film and the insulating layer, a layer of inter-layer dielectric (ILD) formed over the semiconductor film and in the substrate contact hole, and a contact through hole formed in the layer of ILD and in the substrate contact hole, wherein one or more of the first substrate contacts and the second substrate contacts include a salicide layer formed in a bottom of the substrate contact hole, and a metal plug provided in the contact through hole and in the substrate contact hole.

* * * * *

UNITED STATES PATENT AND TRADEMARK OFFICE
CERTIFICATE OF CORRECTION

PATENT NO. : 7,365,396 B2
APPLICATION NO. : 11/105452
DATED : April 29, 2008
INVENTOR(S) : Ping-Wei Wang It is certified that error appears in the above-identified patent and that said Letters Patent is hereby corrected as shown below:

In claim 2, column 7, line 26, "substrate." should read --substrate,--.

In claim 2, column 7, line 27, "layer." should read --layer,--.

In claim 5, column 8, line 33, "ILD." should read --ILD,--.

In claim 7, column 9, line 8, "contacts hole;" should read --contact hole;--.

In claim 15, column 12, line 1, "line." should read --line,--.

Signed and Sealed this

Twenty-ninth Day of July, 2008

JON W. DUDAS
*Director of the United States Patent and Trademark Office*